United States Patent [19]

Murphy et al.

[11] 4,382,977

[45] May 10, 1983

[54] METHOD OF PRODUCING SMOOTH METALLIC LAYERS ON A SUBSTRATE

[75] Inventors: Joseph Murphy, Pittsburgh; William A. Hester, Monroeville, both of Pa.

[73] Assignee: The United States of America as represented by the Secretary of the Army, Washington, D.C.

[21] Appl. No.: 338,790

[22] Filed: Jan. 11, 1982

[51] Int. Cl.³ .......................... B05D 3/06; B05D 5/12
[52] U.S. Cl. ........................................ 427/42; 427/90;
427/123; 427/124; 427/404; 428/433; 428/651;
428/652
[58] Field of Search ................. 427/42, 123, 124, 404,
427/90; 428/651, 652, 433

[56] References Cited

U.S. PATENT DOCUMENTS 4,302,498 11/1981 Faith .................................. 427/42 X

FOREIGN PATENT DOCUMENTS 1067831 5/1967 United Kingdom ................ 427/124

*Primary Examiner*—Michael R. Lusignan
*Attorney, Agent, or Firm*—Nathan Edelberg; Jeremiah G. Murray; Roy E. Gordon

[57] ABSTRACT

Smooth layers of a metal are produced on a glass substrate where a large differential expansion coefficient of the metal relative to the substrate produces very large stresses in the metal when the metallized substrate is subjected to a post deposition anneal. The method involves depositing a layer of a metal having a very small self diffusion coefficient at the anneal temperature prior to depositing the metal having the large differential expansion coefficient.

10 Claims, No Drawings

METHOD OF PRODUCING SMOOTH METALLIC LAYERS ON A SUBSTRATE

The Government has rights in this invention pursuant to contract no. DAAB07-77-C-2697 awarded by the Department of the Army.

This invention relates in general to a method of producing a smooth layer of a metal on a substrate and in particular, to a method of producing a smooth layer of a metal on a glass substrate wherein a large differential expansion coefficient of the metal relative to the glass substrate produces very large stresses in the metal when the metallized substrate is subjected to a post deposition anneal.

BACKGROUND OF THE INVENTION

Thin film conductors separated by thin film insulators are the dominant components of thin film circuitry. Electrical shorts in these components may result from roughness in the bottom conductor. The roughness can develop during the depositions of the metal but it increases when the substrate is annealed. Aluminum is a commonly used conductor material for thin film circuits. Pure aluminum films on glass become badly pock marked with spikes after an eight to ten hour anneal at 400° C. The spikes are believed to develop because the large differential expansion coefficient of the aluminum relative to the glass produces very large stresses in the aluminum. The stress is relieved and the energy thereby reduced when the aluminum atoms migrate in the plane of the film to nucleation centers where crystallites grow in the third dimension, out of the plane, viz, spikes.

SUMMARY OF THE INVENTION

The general object of this invention is to provide a method of producing a smooth layer of a metal on a substrate. A more particular object of the invention is to provide a method of producing a smooth layer of a metal on a glass substrate wherein a large differential expansion coefficient of the metal relative to the glass substrate produces very large stresses in the metal when the metallized substrate is subject to a post deposition anneal. A particular object of the invention is to provide a method of producing a smooth layer of aluminum on a glass substrate that will not roughen and become badly pock marked with spikes after a post deposition anneal.

It has now been found that the aforementioned objects can be attained and a smooth aluminum layer produced by adding and underlying film of copper.

By depositing a layer of copper before depositing the aluminum, after the metallized substrate is subjected to a post deposition anneal, the aluminum will be able to flow into the copper and will not develop spikes. It is necessary to have enough copper so that the migration rate through the copper is greater than the migration rate in the aluminum. The copper then maintains a uniform distribution of the aluminum and hence a smooth film.

DESCRIPTION OF THE PREFERRED EMBODIMENT

A copper film of about 300 to 600 angstroms in thickness is deposited by electron beam evaporation onto the top surface of a glass substrate of about 0.03 to 0.048 mil in thickness. An aluminum film of about 600 to 1200 angstroms in thickness is then deposited by electron beam evaporation over the copper film. After subjecting the metallized substrate to a post deposition anneal of eight to ten hours at 400° C., the aluminum film is found to be firmly adhered to the metallized substrate, smooth and without spikes.

The method of the invention can be used in making transparent electrodes for thin film transistor matrix circuits with a thin film electroluminescent phosphor. The transparent electrodes form part of the output transistor drain pad in the circuit. The light emitted by the electroluminescent element is viewed through the pad.

In the method of the invention in lieu of aluminum, one may use any metal wherein a large differential expansion coefficient of the metal relative to the glass substrate produces very large stresses in the metal when the metallized substrate is subjected to a post deposition anneal.

In lieu of copper, one may use a metal that has a very small self diffusion coefficient at the annealing temperature such as nickel and molybdenum provided that the metal having a large differential expansion coefficient relative to the glass substrate can diffuse rapidly through the metal having a very small self diffusion coefficient at the anneal temperature. The metals having the very small self diffusion coefficient at the anneal temperature do not migrate and therefore do not develop spikes.

In lieu of electron beam evaporation deposition, one may use any standard deposition technique.

We wish it to be understood that we do not desire to be limited to the exact details as described, for obvious modifications will occur to a person skilled in the art.

What is claimed is:

1. Method of producing a smooth layer of a metal on a glass substrate wherein a large differential expansion coefficient of the metal relative to the substrate produces very large stresses in the metal when the metallized substrate is subjected to a post deposition anneal, said method comprising depositing a layer of a metal having a very small self diffusion coefficient at the anneal temperature prior to depositing the metal having the large differential expansion coefficient.

2. Method according to claim 1 wherein an amount of the metal having a very small self diffusion coefficient at the anneal temperature is added such that the migration rate through the metal having a very small self diffusion coefficient at the anneal temperature is greater than the migration rate in the metal having the large differential expansion coefficient.

3. Method according to claim 1 or claim 2 wherein the metal having the large differential expansion coefficient relative to the substrate is aluminum.

4. Method according to claim 1 or claim 2 wherein the metal having the very small self diffusion coefficient at the anneal temperature is selected from the group consisting of copper, nickel, and molybdenum.

5. Method according to claim 4 wherein the metal is copper.

6. Method according to claim 4 wherein the metal is nickel.

7. Method according to claim 4 wherein the metal is molybdenum.

8. Method of producing a smooth layer of aluminum on a glass substrate comprising depositing a layer of copper before depositing the aluminum so that the aluminum will be able to flow into the copper and will not develop spikes when the metallized substrate is subjected to a post deposition anneal.

9. Method of producing a smooth layer of aluminum on a glass substrate comprising depositing a layer of copper before depositing the aluminum, the layer of copper being deposited in such an amount that the migration rate through the copper is greater than the migration rate in the aluminum when the metallized substrate is subjected to a post deposition anneal.

10. Method of producing a smooth layer of aluminum of about 600 to 1200 angstroms in thickness on a glass substrate consisting of electron beam depositing a layer of copper of about 300 to 600 angstroms in thickness before depositing the aluminum so that the aluminum will be able to flow into the copper and will not develop spikes when the metallized substrate is subjected to a post deposition anneal.

* * * * *